(12) United States Patent
Ding

(10) Patent No.: US 10,383,372 B2
(45) Date of Patent: Aug. 20, 2019

(54) CONTROLLING METHOD FOR ELECTRONIC CIGARETTE WITH MULTIPLE OUTPUT MODES AND ELECTRONIC CIGARETTE

(71) Applicant: Ya-Ling Ding, Shenzhen (CN)

(72) Inventor: Ya-Ling Ding, Shenzhen (CN)

( * ) Notice: Subject to any disclaimer, the term of this patent is extended or adjusted under 35 U.S.C. 154(b) by 0 days.

(21) Appl. No.: 16/213,807

(22) Filed: Dec. 7, 2018

(65) Prior Publication Data

US 2019/0104770 A1    Apr. 11, 2019

Related U.S. Application Data

(63) Continuation-in-part of application No. 15/391,874, filed on Dec. 28, 2016, now Pat. No. 10,206,433.

(51) Int. Cl.
*A24F 47/00* (2006.01)
*G01R 19/165* (2006.01)
*H05B 3/00* (2006.01)
*H05B 1/02* (2006.01)

(52) U.S. Cl.
CPC ...... *A24F 47/008* (2013.01); *G01R 19/16542* (2013.01); *H05B 1/02* (2013.01); *H05B 3/0014* (2013.01); *H05B 2203/021* (2013.01)

(58) Field of Classification Search
CPC .................................................. A24F 47/008
See application file for complete search history.

(56) References Cited

U.S. PATENT DOCUMENTS

| 10,206,433 B2 * | 2/2019 | Ding | A24F 47/008 |
| 2018/0177232 A1 * | 6/2018 | Ding | H05B 1/0227 |

* cited by examiner

*Primary Examiner* — James Harvey
(74) *Attorney, Agent, or Firm* — ScienBiziP, P.C.

(57) ABSTRACT

A controlling method for an electronic cigarette with multiple output modes and an electronic cigarette are disclosed. The controlling method comprises receiving a first operation signal for switching between output modes when the electronic cigarette is in a standby state. An output mode is in a memory, the output mode corresponding to the first operation signal and displacing a previous output mode. When the electronic cigarette receives a smoking signal, outputs are controlled according to the output mode stored in the memory. Whether the smoking signal is interrupted is determined when the battery feeds power to the load. The electronic cigarette enters standby state when the smoking signal is interrupted, otherwise whether a duration of the smoking signal reaches a preset duration is determined. If yes, the load is stopped charging and a hint is generated for indicating that a working duration of the electronic cigarette is too long.

18 Claims, 4 Drawing Sheets

CONTROLLING METHOD FOR ELECTRONIC CIGARETTE WITH MULTIPLE OUTPUT MODES AND ELECTRONIC CIGARETTE

FIELD

The subject matter relates to electronic cigarettes, and more particularly, to a controlling method for an electronic cigarette with multiple output modes and an electronic cigarette.

BACKGROUND

Usually, electronic cigarettes control outputs by a constant voltage output mode. However, if the outputs of an electronic cigarette are controlled only by a constant voltage output mode, the output method may lack diversity, thus failing to satisfy the user need of diversity and failing to improve the user experience.

BRIEF DESCRIPTION OF THE DRAWINGS

Implementations of the present technology will now be described, by way of example only, with reference to the attached figures.

DETAILED DESCRIPTION

The present disclosure, including the accompanying drawings, is illustrated by way of examples and not by way of limitation. In general, the word "module," as used hereinafter, refers to logic embodied in hardware or firmware, or to a collection of software instructions, written in a programming language, such as, for example, Java, C, or assembly. One or more software instructions in the modules may be embedded in firmware. It will be appreciated that modules may comprise connected logic units, such as gates and flip-flops, and may comprise programmable units, such as programmable gate arrays or processors. The modules described herein may be implemented as either software and/or hardware modules and may be stored in any type of non-transitory computer-readable storage medium or other computer storage device. The term "comprising," when utilized, means "including, but not necessarily limited to"; it specifically indicates open-ended inclusion or membership in the so-described combination, group, series, and the like.

Figure 1:
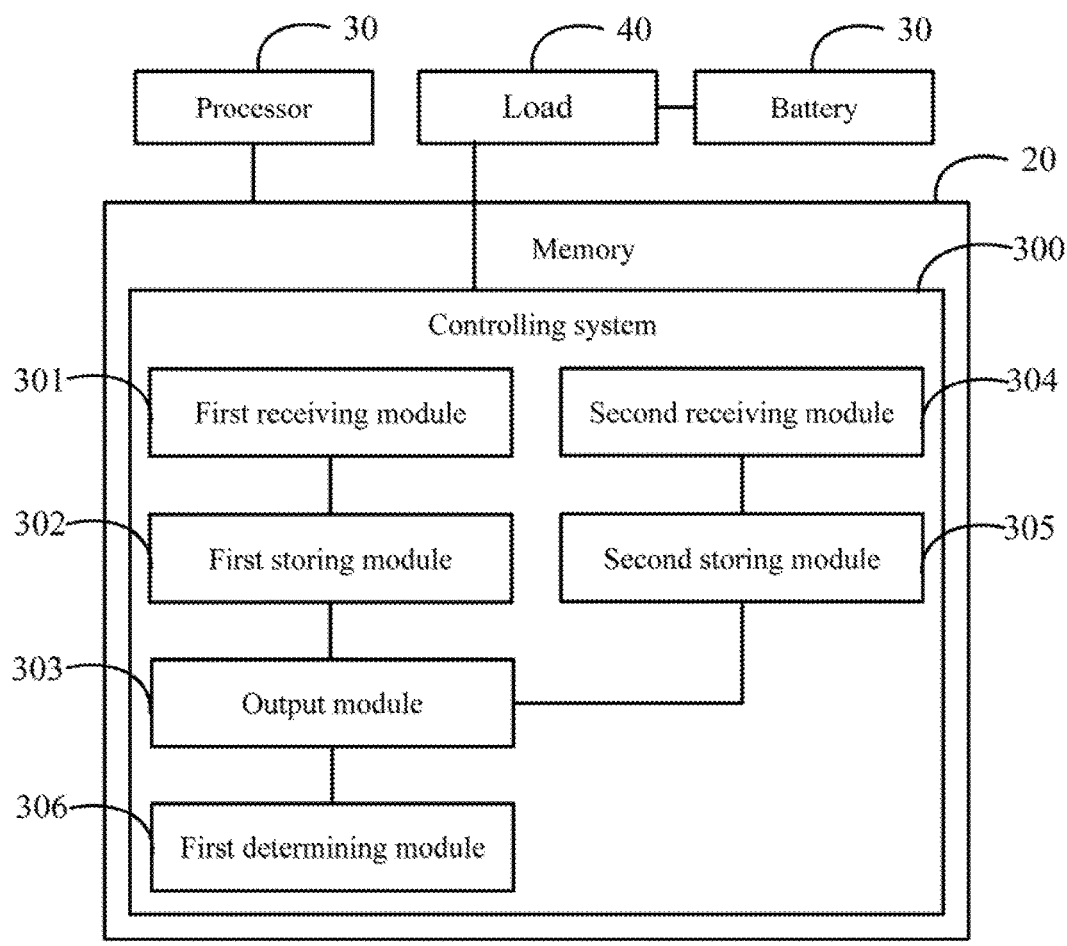
FIG. 1 is a block diagram of a first embodiment of an electronic cigarette with multiple output modes.

FIG. 1 illustrates a first embodiment of an electronic cigarette 100. The electronic cigarette 100 comprises a memory 20 and at least one processor 30. The memory 20 stores a controlling system 300 for the electronic cigarette 100 with multiple output modes. The controlling system 300 comprises a first receiving module 301, a first storing module 302, and an output module 303. The controlling system 300 can further comprise a second receiving module 304 and a second storing module 305. The modules 301-305 may comprise computerized instructions in the form of one or more programs that are stored in the memory 20 and executed by the at least one processor 30. A detailed description of each module will be given in the following paragraphs.

Figure 2:
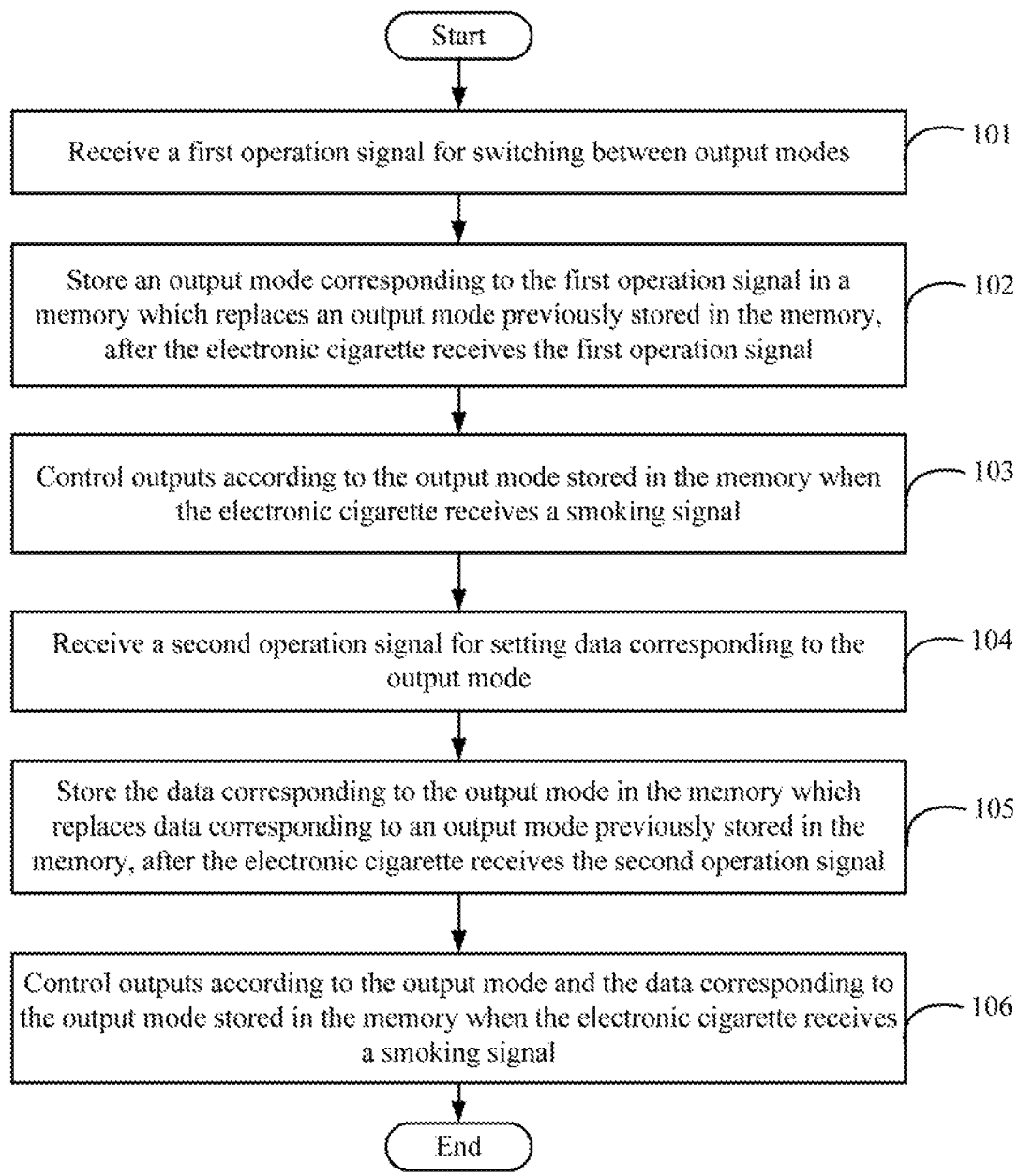
FIG. 2 is a flowchart of a first embodiment of a controlling method for an electronic cigarette with multiple output modes.

FIG. 2 illustrates a first embodiment of a controlling method for an electronic cigarette with multiple output modes. Depending on the first embodiment, additional steps may be added, others removed, and the ordering of the steps may be changed.

At step 101, the first receiving module 301 receives a first operation signal for switching between output modes.

In this embodiment, the electronic cigarette 100 further comprises a load 40 and a battery 50 electrically connected to the load 40. The output modes comprise at least two of temperature controlling mode, constant voltage/constant power mode, voltage/power mode, and BYPASS mode. A user can control the electronic cigarette 100 to switch between output modes as needed. The working temperature of the electronic cigarette 100 can be adjusted when the electronic cigarette 100 is in the temperature controlling mode. The user can adjust the working temperature of the load 40 as needed. For example, the working temperature can be adjusted to 450 Fahrenheit degrees. The constant voltage/constant power mode is a mode in which voltage/power is constant. The output voltage/output power of the load 40 is a preset and non-adjustable value pre-stored in the electronic cigarette 100. For example, the output voltage is preset to be 4V, or the output power is preset to be 30W. The voltage/power mode is a mode in which voltage/power can be adjusted. The user can adjust the output voltage/output power to the load 40 as needed. For example, the output voltage can be adjusted to 4V, or the output power can be adjusted to 80W. The BYPASS mode is a mode in which voltage, power, and working temperature cannot be adjusted. The battery 50 directly feeds the current level of voltage to the load 40. The load 40 is an atomizer (not shown) of the electronic cigarette 100. In detail, the load 40 is a heat generating element (not shown) of the atomizer.

In this embodiment, for an electronic cigarette 100 having buttons, the user can use a button to input to the controlling system 300 the first operation signal for switching between output modes. In detail, the user can input the first operation signal by a preset operation on a preset button. The preset operation can comprise pressing the preset button for a preset number of times, pressing the preset button for a preset time period, moving the preset button to a preset location, or a combination thereof. The preset button can be a power button or a mode switching button of the electronic cigarette. In actual use, the preset button can also be a combination of at least two buttons. For example, the preset button can be a combination of the power button and the mode switching button.

In an embodiment, the first receiving module 301 can receive the first operation signal when the electronic cigarette is in a standby state or a power-off state.

For example, when the electronic device is in the standby state or the power-off state, and the user wants to switch between output modes, the user can press the power button for a preset number of times, such as three times, to cause the names of output modes to be flashed. Then, the user can press the "+" button or the "−" button to switch between output modes. The "+" button represents a mode such as the temperature controlling mode, and the "−" button represents another mode such as the voltage/power mode. Alternatively, the "+" button represents a next mode, and the "−" button represents a previous mode. The user also needs to preset a confirming button for switching between output modes, that is, the user can press the "+" button or the "−" button to select an output mode, and finally press the confirming button to confirm the selected output mode.

Again, for example, when the electronic device is in the standby state or the power-off state, and the user wants to switch between output modes, the user can press the mode button for a time period greater than or equal to a number of seconds, such as five seconds, to cause the electronic cigarette 100 to switch to an output mode different from the current output mode. Otherwise, the electronic cigarette 100 remains in the current output mode.

In another embodiment, for an electronic cigarette 100 having a touch panel, the user can input the first operation signal for switching between output modes to the controlling system 300 by pressing a menu on the touch panel. For example, when the electronic device is in the standby state and the current output mode of the electronic cigarette 100 is the temperature controlling mode, the user can slide to left, or right, or click on the touch panel, when the user wants to switch between output modes.

In this embodiment, the temperature controlling mode comprises nickel temperature controlling mode, titanium temperature controlling mode, 316 stainless steel temperature controlling mode, customized temperature controlling mode, or a combination thereof. The nickel temperature controlling mode is a mode when the heat generating element is made of nickel. The titanium temperature controlling mode is a mode when the heat generating element is made of titanium. The 316 stainless steel temperature controlling mode is a mode when the heat generating element is made of 316 stainless steel. The customized temperature controlling mode is a mode the electronic cigarette 100 controls temperature according to input parameter information. The input parameter information comprises material of the heat generating element and temperature coefficient of resistance of the heat generating element. After the user selects the temperature controlling mode, the user can further select one of nickel temperature controlling mode, titanium temperature controlling mode, 316 stainless steel temperature controlling mode, and customized temperature controlling mode, according to the material of the heat generating element of the atomizer.

At step 102, the first storing module 302 stores an output mode corresponding to the first operation signal in the memory 20 which replaces an output mode previously stored in the memory 20.

At step 103, when the electronic cigarette 100 receives a smoking signal, the output module 303 controls outputs according to the output mode stored in the memory 20.

At step 104, the second receiving module 304 receives a second operation signal for setting data corresponding to the output mode.

In this embodiment, after the user selects the output mode for the electronic cigarette 100, if the data of the output mode can be user-set, the user can further set the data corresponding to the output mode as needed. When the output mode is the temperature output mode, the data comprises the working temperature corresponding to the temperature controlling mode. For example, the working temperature of the temperature controlling mode is set to be 450 Fahrenheit degrees. When the output mode is the voltage/power mode, the data comprises the output voltage/output power corresponding to the voltage/power mode. For example, the output voltage of the voltage mode is set to be 4V, or the output power of the power mode is set to be 80 W.

In this embodiment, the user can input the second operation signal for setting the data corresponding to the output mode to the electronic cigarette 100 through a button. In detail, the user can input the second operation signal for setting the data corresponding to the output mode to the electronic cigarette 100 through a preset operation on a preset button. The preset operation can comprise pressing the preset button for a preset number of times, pressing the preset button for a preset time period, moving the preset button to a preset location, or a combination thereof. For example, the user can press the mode button for three times, to cause the name of the output mode to be flashed. Then, the user can press the "−" button twice, and finally press the "+" button to increase the voltage/power or press the "−" button to decrease the voltage/power. Again, for example, the user can press the mode button for five seconds, to cause the name of the output mode to be flashed. Then, the user can press the "−" button twice, and finally press the "+" button to increase the voltage/power or press the "−" button to decrease the voltage/power.

In another embodiment, the user can also input the second operation signal for setting the data corresponding to the output mode to the electronic cigarette 100 through the touch panel. For example, the user can directly click on the menu on the touch panel to set the data corresponding to the output modes.

At step 105, after the second receiving module 304 receives the second operation signal, the second storing module 305 stores the data corresponding to the output mode in the memory 20 which replaces data corresponding to an output mode previously stored in the memory 20.

At step 106, the output module 303 controls outputs according to the output mode and the data corresponding to the output mode stored in the memory 20, when the electronic cigarette 100 receives a smoking signal.

If the first receiving module 301 receives no first operation signal, the output module 303 controls outputs according to the output mode stored in the memory 20 when the electronic cigarette 100 receives the smoking signal. The output mode stored in the memory 20 may be a default output mode or an output mode previously stored in the memory 20. In this embodiment, if the user uses the electronic cigarette 100 for the first time and the first receiving module 301 receives no first operation signal, the output module 303 controls outputs according to a default output mode when the electronic cigarette 100 receives the smoking signal. In another embodiment, when the first receiving module 301 receives no first operation signal and the electronic cigarette 100 receives the smoking signal, the output module 303 controls outputs according to the output mode previous stored in the memory 20. For example, if the output mode previously stored in the memory 20 is the temperature controlling mode, the output module 303 controls outputs according to the temperature controlling mode when the first receiving module 301 receives no first operation signal.

The user cannot set data for the constant voltage/constant power mode and the BYPASS mode. So, if the constant voltage/constant power mode or the BYPASS mode is stored in the memory 20, the electronic cigarette 100 can instantly work when the electronic cigarette 100 receives the smoking signal. The user can set data for the temperature controlling mode and the voltage/power mode. So, if the temperature controlling mode or the voltage/power mode is stored in the memory 20, and the second receiving module 304 receives no second operation signal for setting the data corresponding to the output mode, the output module 303 controls outputs according to the output mode previously stored in the memory 20 and the default data corresponding to the output mode. Alternatively, the output module 303 can control outputs according to the output mode and the data corresponding to the output mode previously stored in the memory 20.

In addition, since the material of the load 40 may be different, a changing rate of a resistance value of the load 40 with temperatures is also different when the electronic cigarette 100 is working. For example, the resistance value of the load 40 made of nickel-chromium alloy has a small changing rate. The resistance value of the load 40 made of titanium, nickel, or 316 stainless steel has a large changing rate. When the electronic cigarette 100 is under the temperature controlling mode, the controlling system 300 needs to calculate an actual temperature according to the changing rate of the resistance value of the heat generating element, then compares the actual temperature with a preset temperature, and finally controls outputs to achieve temperature control. So, if the heat generating element is made of nickel-chromium alloy having a small changing rate of resistance value, the controlling system 300 cannot achieve temperature control.

Thus, referring to FIG. 1, the controlling system 300 can further comprise a first determining module 306. If the user selects the temperature controlling mode, when the electronic cigarette 100 is working (that is, when the electronic cigarette 100 receives the smoking signal and the output module 300 controls outputs according to the temperature controlling mode), the first determining module 306 detects the resistance value of the load 40 and determines a relationship between the changing rate of the resistance value of the load 40 and a preset changing rate. When the changing rate of the resistance value of the load 40 is greater than or equal to the preset changing rate, the output module 303 continues controlling outputs according to the temperature controlling mode. When the changing rate of the resistance value of the load 40 is less than the preset changing rate, the output module 303 can control outputs by switching to the constant voltage/constant power mode or the voltage/power mode.

The above controlling system 300 receives the first operation signal for switching between output modes, and controls outputs according to the output mode corresponding to the first operation signal. The present disclosure can overcome the above-described shortcomings of the existing technology that the electronic cigarette 100 controls outputs only by a constant voltage output mode, the output method thus lacking diversity, and thus failing to satisfy the user need of diversity and failing to improve the user experience. Furthermore, the present disclosure can provide the user with multiple output modes, thus satisfying the user need of diversity and improving the user experience.

In addition, the controlling system 300 receives the second operation signal for setting data corresponding to the output mode, stores the data corresponding to the output mode in the memory 20, and controls outputs according to the output mode and the data corresponding to the output mode stored in the memory 20. Thus, the user can adjust the data as needed based on the output mode, which further satisfies the user need and improves the user experience.

Figure 3:
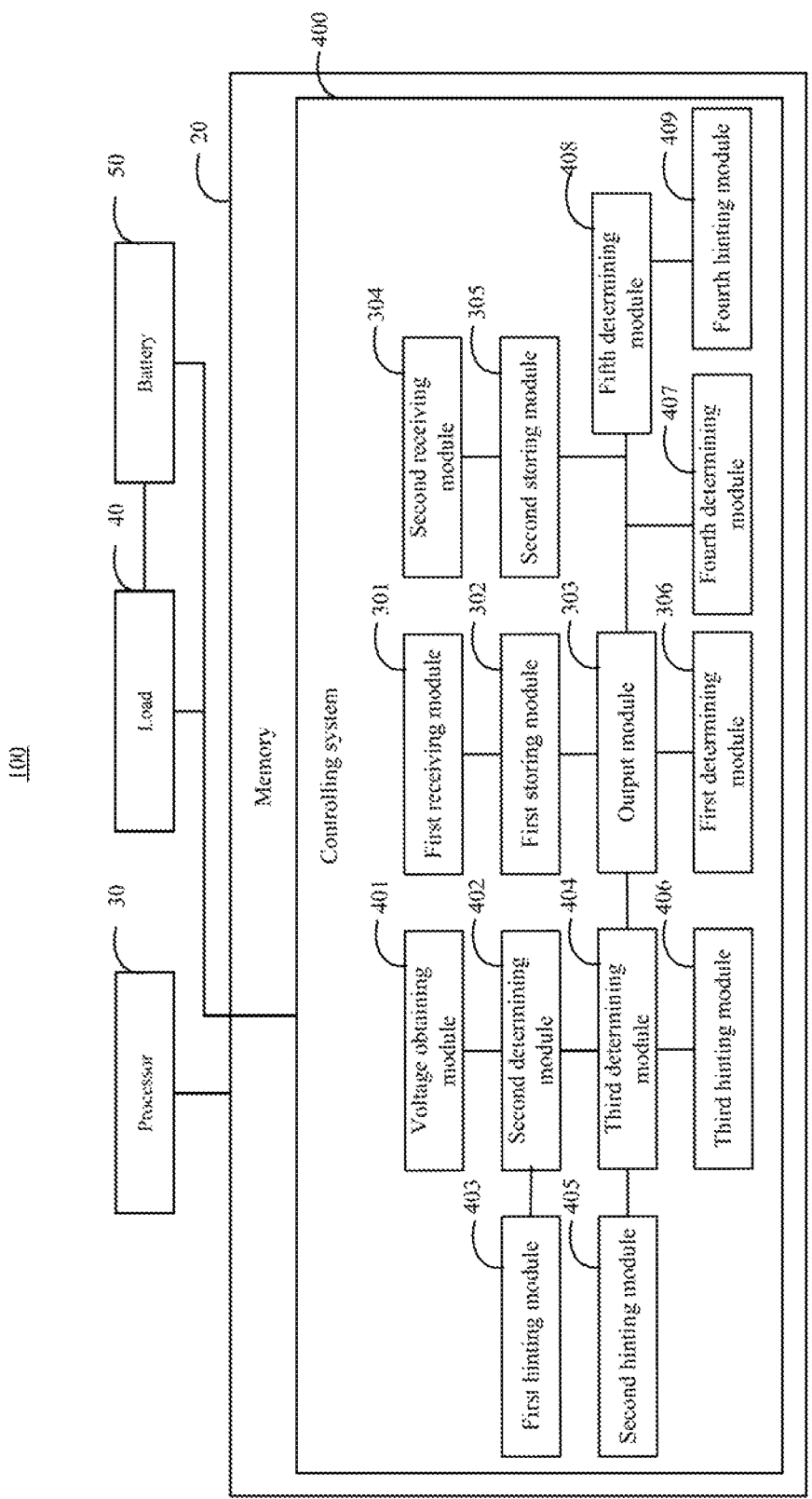
FIG. 3 is a block diagram of a second embodiment of an electronic cigarette with multiple output modes.

FIG. 3 illustrates a second embodiment of a controlling system 400 for an electronic cigarette with multiple output modes. Different from the first embodiment, the controlling system 400 further comprises a voltage obtaining module 401, a second determining module 402, a first hinting module 403, a third determining module 404, a second hinting module 405, and a third hinting module 406. The modules 401-406 may comprise computerized instructions in the form of one or more programs that are stored in the memory 20 and executed by the at least one processor 30. A detailed description of each module will be given in the following paragraphs.

Figure 4:
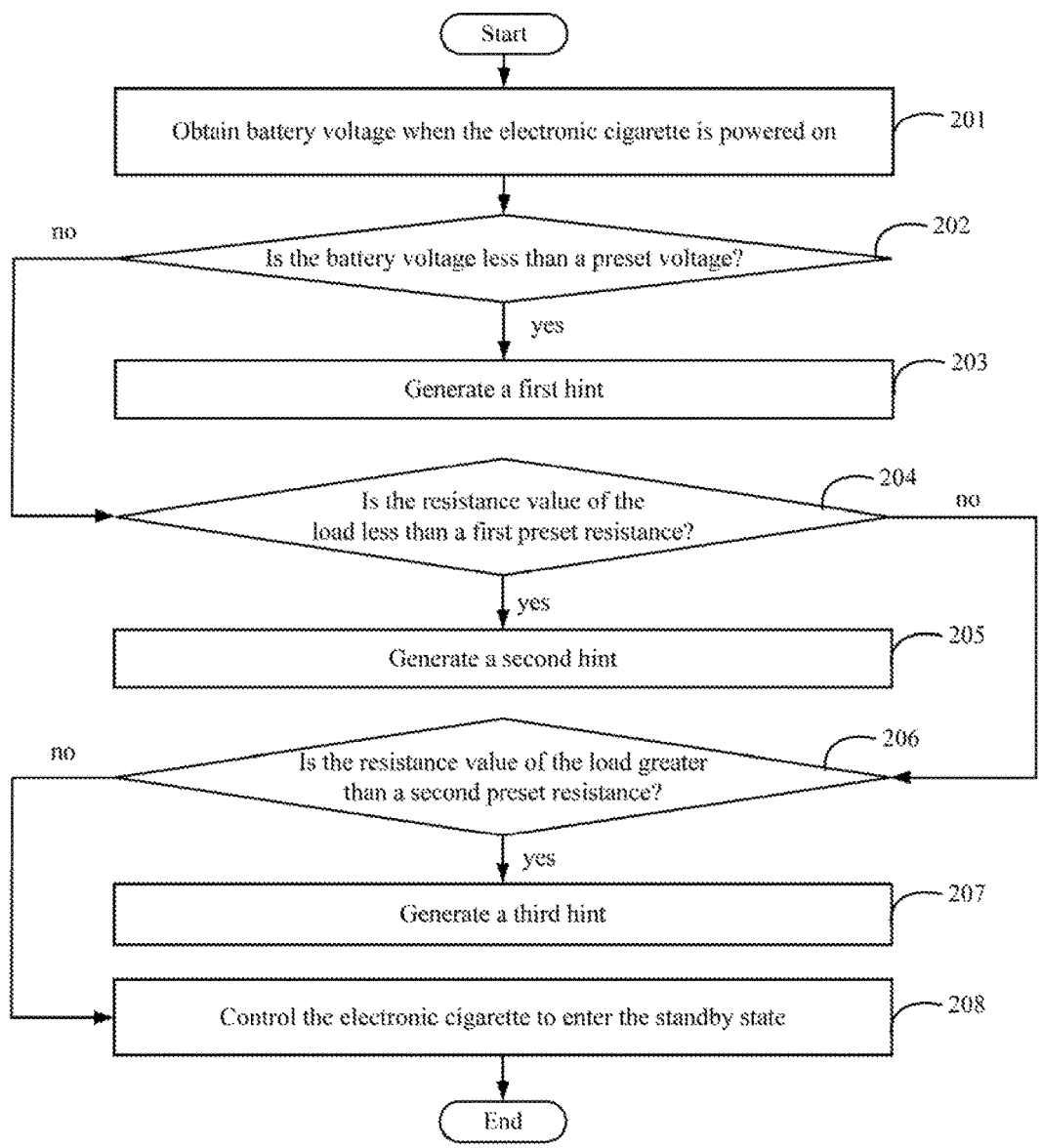
FIG. 4 is a flowchart of a second embodiment of a controlling method for an electronic cigarette with multiple output modes.

FIG. 4 illustrates a second embodiment of a controlling method for an electronic cigarette with multiple output modes. Depending on the second embodiment, additional steps may be added, others removed, and the ordering of the steps may be changed.

At step 201, when the electronic cigarette 100 is powered on, the voltage obtaining module 401 obtains battery voltage of the battery 50.

In this embodiment, the user can lock or unlock the electronic cigarette 100, namely, power on or power off the electronic cigarette 100, by operating the button. For example, the user can press the power button 5 times or for 8 seconds to unlock or lock the electronic cigarette 100.

At step 202, the second determining module 402 determines a relationship between the battery voltage and a preset voltage. When the battery voltage is less than the preset voltage, the procedure goes to step 203; otherwise, the procedure goes to step 204.

At step 203, the first hinting module 403 generates a first hint.

The first hint is for indicating that the battery voltage is too low. The preset voltage can be set according to an empirical value which is not limited in the preset disclosure. Taking the preset voltage of 3.3V for example, when the voltage obtaining module 401 detects that the battery voltage is less than 3.3V, the first hinting module 403 generates the first hint for indicating that the battery voltage is too low and the battery thus cannot feed the load 40 any longer. As such, the service life of the battery 50 can be increased. In addition, the first hint is given visually. The first hint can be indicated to the user by an indicating lamp, for example, by flashing a red indicating lamp. The first hint can also be indicated to the user through the display screen of the electronic cigarette 100, for example, the first hint directly indicates on the display screen that the battery voltage is too low. The first hint can also be indicated to the user by vibrating the electronic cigarette 100. The first hint can also be indicated to the user audibly. These means described are not to limit the present disclosure.

At step 204, the third determining module 404 determines a relationship between the resistance value of the load 40 and a first preset resistance.

The third determining module 404 determines whether the load 40 is connected to the controlling system 400. Specifically, if the level of the connecting points of the load 40 is low, the load 40 is connected to the controlling system 400. If the level of the connecting points of the load 40 is high, no load is connected to the controlling system 400. When the load 40 is connected to the controlling system 400, the third determining module 404 determines the relationship between the resistance value of the load 40 and the first preset resistance, to decide the security of the circuit. When the resistance value of the load 40 is less than the first preset resistance, the procedure goes to step 205; otherwise, the procedure goes to step 206.

At step 205, the second hinting module 405 generates a second hint.

The second hint is for indicating that a short circuit may exist which may cause a hidden danger. The second hint is given visually. The second hint can be indicated to the user by an indicating lamp, for example, by continuous light from a red indicating lamp. The second hint can also be indicated to the user through the display screen of the electronic cigarette 100, for example, the second hint can be directly indicated on the display screen. The second hint can also be indicated to the user by vibrating the electronic cigarette 100. The second hint can also be indicated to the user audibly. These means described are not to limit the present disclosure.

At step 206, the third determining module 404 determines a relationship between the resistance value of the load 40 and a second preset resistance.

In this embodiment, to avoid the resistance value of the load 40 being too large to cause a low heat generating efficiency, the third determining module 404 determines the relationship between the resistance value of the load 40 and the second preset resistance. When the resistance value of the load 40 is greater than the second preset resistance, the procedure goes to step 207; otherwise, the procedure goes to step 208.

At step 207, the third hinting module 406 generates a third hint.

The third hint is for indicating that the resistance value of the load 40 is too large and the heat generating efficiency is low. The second preset resistance is greater than the first preset resistance. The third hint is given visually. The third hint can be indicated to the user by an indicating lamp, for example, by continuous light from an orange indicating lamp. The third hint can also be indicated to the user through the display screen of the electronic cigarette 100, for example, the third hint can be directly indicated on the display screen. The third hint can also be indicated to the user by vibrating the electronic cigarette 100. The third hint can also be indicated audibly. This is not to limit the present disclosure.

At step 208, the output module 303 controls the electronic cigarette 100 to enter the standby state.

In another embodiment, at step 202, when the second determining module 402 determines that the battery voltage is greater than or equal to the preset voltage, the procedure directly goes to step 208. That is, when the battery voltage is greater than or equal to the preset voltage, the output module 303 controls the electronic cigarette 100 to enter the standby state.

After the step 208, the user can perform steps of switching output mode and setting data as described in the first embodiment, and then begin smoking. The user can also directly smoke without the need to switch output mode and set data beforehand.

Referring to FIG. 3, the controlling system 400 can further comprise a fourth determining module 407, a fifth determining module 408, and a fourth hinting module 409. To avoid a long working duration of the load 40 which may result in overheating, when the battery 50 feeds power to the load 40 according to the smoking signal, the fourth determining module 407 determines whether the smoking signal is interrupted. When the smoking signal is interrupted, the output module 303 controls the electronic cigarette 100 to enter the standby state. As long as the smoking signal is not interrupted, the fifth determining module 408 determines whether a duration of the smoking signal reaches a preset duration. When the duration of the smoking signal reaches the preset duration, the fourth hinting module 409 stops feeding power to the load 40 and generates a fourth hint for indicating that the working duration of the electronic cigarette 100 is too long. Taking a preset duration of 10 seconds for example, when the battery 50 feeds power to the load 40 for 10 seconds, the fourth hinting module 409 stops feeding power to the load 40 which causes the electronic cigarette 100 to enter the standby state, and generates the fourth hint. The fourth hint is given visually. The fourth hint can be indicated to the user by an indicating lamp. The fourth hint can also be indicated to the user through the display screen of the electronic cigarette 100. The fourth hint can also be indicated by vibrations. The fourth hint can also be indicated audibly. This is not to limit the present disclosure.

At step 201, the controlling system 400 can further generate a fifth hint for indicating a remaining battery voltage. The fifth hint is given visually. In this embodiment, the fifth hint can be indicated by an indicating lamp with different colors, for example, by green to indicate that the remaining voltage is greater than 60%, by yellow to indicate that the remaining voltage is greater than 30% and less than 60%, and by red to indicate that the remaining voltage is less than 30%. In another embodiment, the fifth hint can also be directly indicated on the display screen, for example, that the remaining voltage is 80% of full power.

In this embodiment, before the controlling system 400 receives a third operation signal for unlocking a functionality of the button or the touch panel, the controlling system 400 locks the button or the touch panel. That is, the functionality of the button or the touch panel is locked when the button or the touch panel is locked. Then, the user cannot operate the button or the touch panel.

In this embodiment, the user can set the content displayed on the display screen of the electronic cigarette 100. The content comprises time, date, names of the output modes, voltage, current, power, battery power, brand identification, temperature, number of times smoked, time period for smoking, or a combination thereof.

The controlling system 400 of the above embodiment detects the battery voltage, the resistance value of the load 40, and the working duration when the electronic cigarette 100 is powered on. When the battery voltage, the resistance value of the load 40, or the working duration is not within preset range, the controlling system 400 gives a hint to the user, thereby improving the security and increasing the service life of the electronic cigarette 100.

The controlling system 400 receives the first operation signal for switching between output modes when the electronic cigarette 100 is in the standby state. Outputs are controlled according to the output mode corresponding to the first operation signal. The present disclosure can overcome the above-described shortcomings of the existing technology that the electronic cigarette 100 controls outputs only by a constant voltage output mode, thus the output method lacking diversity, and thus failing to satisfy the user need of diversity and failing to improve the user experience. Furthermore, the present disclosure can provide the user with multiple output modes, thus satisfying the user need of diversity and improving the user experience.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A controlling method for an electronic cigarette with multiple output modes, the electronic cigarette comprising a battery and a load electrically connected to the battery, the controlling method comprising:

receiving a first operation signal for switching between output modes;

storing an output mode corresponding to the first operation signal in a memory which replaces an output mode previously stored in the memory, after the electronic cigarette receives the first operation signal;

controlling outputs according to the output mode stored in the memory when the electronic cigarette receives a smoking signal, determining whether the smoking signal is interrupted when the battery feeds power to the load according to the smoking signal;

controlling the electronic cigarette to enter a standby state when the smoking signal is interrupted, and determining whether a duration of the smoking signal reaches a preset duration when the smoking signal is not interrupted; and stopping charging the load and generating a hint for indicating that a working duration of the electronic cigarette is too long, when the duration of the smoking signal reaches the preset duration.

2. The controlling method of claim 1, wherein the output modes comprise at least two of temperature controlling mode, constant voltage/constant power mode, voltage/power mode, and BYPASS mode.

3. The controlling method of claim 2, wherein a step of "storing an output mode corresponding to the first operation signal in a memory" further comprises:

receiving a second operation signal for setting data corresponding to the output mode; and storing the data corresponding to the output mode in the memory which replaces data corresponding to an output mode previously stored in the memory.

4. The controlling method of claim 3, wherein when the output mode is the temperature controlling mode, the data comprises a working temperature corresponding to the temperature controlling mode; when the output mode is the voltage/power mode, the data comprises an output voltage/output power corresponding to the voltage/power mode.

5. The controlling method of claim 3, wherein a step of "controlling outputs according to the output mode stored in the memory" further comprises:

controlling outputs according to the output mode and the data corresponding to the output mode stored in the memory.

6. The controlling method of claim 2, further comprising:

detecting a resistance value of the load and determining a relationship between a changing rate of the resistance value of the load and a preset changing rate, when the output mode is the temperature controlling mode;

continuing controlling outputs according to the temperature controlling mode when the changing rate of the resistance value of the load is greater than or equal to the preset changing rate; and controlling outputs by switching to the constant voltage/constant power mode or the voltage/power mode when the changing rate of the resistance value of the load is less than the preset changing rate.

7. The controlling method of claim 1, further comprising:

obtaining a battery voltage of the battery when the electronic cigarette is powered on;

determining a relationship between the battery voltage and a preset voltage;

generating a hint for indicating that the battery voltage is too low when the battery voltage is less than the preset voltage; and controlling the electronic cigarette to enter the standby state when the battery voltage is greater than or equal to the preset voltage.

8. The controlling method of claim 7, wherein a step of "controlling the electronic cigarette to enter the standby state when the battery voltage is greater than or equal to the preset voltage" further comprises:

determining a relationship between the resistance value of the load and a first preset resistance when the battery voltage is greater than or equal to the preset voltage;

generating a hint for indicating that the resistance value of the load is too low when the resistance value of the load is less than the first preset resistance;

determining a relationship between the resistance value of the load and a second preset resistance when the resistance value of the load is greater than or equal to the first preset resistance;

controlling the electronic cigarette to enter the standby state when the resistance value of the load is less than or equal to the second preset resistance; and generating a hint for indicating that the resistance value of the load is too large when the resistance value of the load is greater than the second preset resistance;

wherein the second preset resistance is greater than the first preset resistance.

9. The controlling method of claim 1, wherein operations for generating the first operation signal comprises pressing a preset button for a preset number of times, pressing the preset button for a preset time period, moving the preset button to a preset location, clicking on a touch panel, sliding on the touch panel, or a combination thereof.

10. An electronic cigarette with multiple output modes comprising:

a battery;

a load electrically connected to the battery;

at least one processor; and a memory coupled to the at least one processor and configured to store one or more programs, which when executed by the at least one processor, cause the at least one processor to:

receive a first operation signal for switching between output modes;

store an output mode corresponding to the first operation signal in a memory which replaces an output mode previously stored in the memory, after the electronic cigarette receives the first operation signal;

control outputs according to the output mode stored in the memory, when the electronic cigarette receives a smoking signal;

determine whether the smoking signal is interrupted when the battery feeds power to the load according to the smoking signal;

control the electronic cigarette to enter a standby state when the smoking signal is interrupted, and determine whether a duration of the smoking signal reaches a preset duration when the smoking signal is not interrupted; and stop charging the load and generate a hint for indicating that a working duration of the electronic cigarette is too long, when the duration of the smoking signal reaches the preset duration.

11. The electronic cigarette of claim 10, wherein the output modes comprise at least two of temperature controlling mode, constant voltage/constant power mode, voltage/power mode, and BYPASS mode.

12. The electronic cigarette of claim 11, wherein the at least one processor is further configured to:
receive a second operation signal for setting data corresponding to the output mode; and
store the data corresponding to the output mode in the memory which replaces data corresponding to an output mode previously stored in the memory.

13. The electronic cigarette of claim 12, wherein when the output mode is the temperature controlling mode, the data comprises a working temperature corresponding to the temperature controlling mode; when the output mode is the voltage/power mode, the data comprises an output voltage/output power corresponding to the voltage/power mode.

14. The electronic cigarette of claim 12, wherein the at least one processor is further configured to control outputs according to the output mode and the data corresponding to the output mode stored in the memory.

15. The electronic cigarette of claim 11, wherein the at least one processor is further configured to:
detect a resistance value of the load and determine a relationship between a changing rate of the resistance value of the load and a preset changing rate, when the output mode is the temperature controlling mode;
continue controlling outputs according to the temperature controlling mode when the changing rate of the resistance value of the load is greater than or equal to the preset changing rate; and
control outputs by switching to the constant voltage/constant power mode or the voltage/power mode when the changing rate of the resistance value of the load is less than the preset changing rate.

16. The electronic cigarette of claim 10, wherein the at least one processor is further configured to:
obtain a battery voltage of the battery when the electronic cigarette is powered on;
determine a relationship between the battery voltage and a preset voltage;
generate a hint for indicating that the battery voltage is too low when the battery voltage is less than the preset voltage;
control the electronic cigarette to enter the standby state when the battery voltage is greater than or equal to the preset voltage.

17. The electronic cigarette of claim 16, wherein the at least one processor is further configured to:
determine a relationship between the resistance value of a load and a first preset resistance when the battery voltage is greater than or equal to the preset voltage;
generate a hint for indicating that the resistance value of the load is too low when the resistance value of the load is less than the first preset resistance;
determine a relationship between the resistance value of the load and a second preset resistance when the resistance value of the load is greater than or equal to the first preset resistance;
control the electronic cigarette to enter the standby state when the resistance value of the load is less than or equal to the second preset resistance; and
generate a hint for indicating that the resistance value of the load is too large when the resistance value of the load is greater than the second preset resistance;
wherein the second preset resistance is greater than the first preset resistance.

18. The electronic cigarette of claim 10, wherein operations for generating the first operation signal comprises pressing a preset button for a preset number of times, pressing the preset button for a preset time period, moving the preset button to a preset location, clicking on a touch panel, sliding on the touch panel, or a combination thereof.

* * * * *